United States Patent
Ryu et al.

(10) Patent No.: US 6,525,988 B2
(45) Date of Patent: Feb. 25, 2003

(54) CLOCK GENERATING CIRCUITS CONTROLLING ACTIVATION OF A DELAY LOCKED LOOP CIRCUIT ON TRANSITION TO A STANDBY MODE OF A SEMICONDUCTOR MEMORY DEVICE AND METHODS FOR OPERATING THE SAME

(75) Inventors: Dong-ryul Ryu, Kyungki-do (KR); Chi-wook Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/884,774

(22) Filed: Jun. 19, 2001

(65) Prior Publication Data

US 2002/0064083 A1 May 30, 2002

(30) Foreign Application Priority Data

Nov. 24, 2000 (KR) .......................................... 2000-70489

(51) Int. Cl.⁷ .............................. G11C 8/00; G11C 7/00
(52) U.S. Cl. ........................ 365/233; 365/194; 365/227; 365/229; 365/236
(58) Field of Search ................................ 365/233, 229, 365/227, 236, 19.4

(56) References Cited

U.S. PATENT DOCUMENTS

| | | | | |
|---|---|---|---|---|
| 5,751,655 A | * | 5/1998 | Yamazaki et al. | 365/222 |
| 5,801,554 A | * | 9/1998 | Momma et al. | 326/81 |
| 5,822,264 A | * | 10/1998 | Tomishima et al. | 365/222 |
| 6,125,078 A | * | 9/2000 | Ooishi et al. | 365/230.03 |
| 6,134,179 A | * | 10/2000 | Ooishi | 365/200 |
| 6,166,990 A | * | 12/2000 | Ooishi et al. | 365/194 |
| 6,198,689 B1 | * | 3/2001 | Yamazaki et al. | 327/156 |
| 6,230,280 B1 | * | 5/2001 | Okasaka | 713/400 |
| 6,337,828 B2 | * | 1/2002 | Ooishi et al. | 365/226 |
| 6,337,832 B1 | * | 1/2002 | Ooishi et al. | 365/230.01 |
| 6,366,515 B2 | * | 4/2002 | Hidaka | 365/201 |
| 6,396,768 B2 | * | 5/2002 | Ooishi | 365/189.05 |

* cited by examiner

Primary Examiner—David Nelms
Assistant Examiner—Ly Duy Pham
(74) Attorney, Agent, or Firm—Myers Bigel Sibley & Sajovec (57) ABSTRACT

Clock generating circuits for a semiconductor memory device are provided. The clock generating circuits include a delay locked loop (DLL) circuit that generates an internal clock signal for the semiconductor memory device. A control circuit activates the delay locked loop circuit for a predetermined time when the semiconductor memory device transitions from a self refresh mode, in which the DLL circuit is deactivated, to a standby mode. The control circuit may also be configured to deactivate the DLL circuit when the semiconductor memory device transitions from a power down mode, in which the DLL circuit is activated, to the standby mode. The semiconductor memory device may be a dynamic random access memory device and the predetermined time may be a number of clock cycles of the internal clock signal. Methods for operating the same are also provided.

36 Claims, 7 Drawing Sheets

CLOCK GENERATING CIRCUITS CONTROLLING ACTIVATION OF A DELAY LOCKED LOOP CIRCUIT ON TRANSITION TO A STANDBY MODE OF A SEMICONDUCTOR MEMORY DEVICE AND METHODS FOR OPERATING THE SAME

RELATED APPLICATION

This application claims priority from Korean Application No. 00-70489, filed Nov. 24, 2000, the disclosure of which is hereby incorporated herein by reference.

FIELD OF THE INVENTION

The present invention relates to integrated circuit devices, and more particularly to semiconductor memory devices containing delay locked loop circuits and methods of operating same.

BACKGROUND OF THE INVENTION

Many integrated circuit devices (e.g., memory devices) operate in-sync with externally supplied clock signals by generating one or more internal clock signals that are preferably phase locked with the external clock signal and with each other. As will be understood by those skilled in the art, accurate phase locking of clock signals can be especially important for integrated circuit devices, such as semiconductor memory devices, that operate at high frequencies. Such integrated circuit devices may include merged memory with logic (MML) devices, Rambus DRAM devices and double data rate synchronous DRAM devices (DDR-SDRAM). Semiconductor memory devices such as a selected circuit DRAM generally provide a power down mode for deactivating selected circuit blocks inside the DRAM. In other words, some, but not all, of the circuit blocks inside the DRAM may be deactivated in order to reduce power consumption by the DRAM.

The power down modes of a DRAM may include an active power down mode, a precharge power down mode, and a self-refresh mode. When the DRAM is in the active power down mode or the precharge power down mode, all input buffers excluding an input buffer connected to a system clock (CLK) pin and an input buffer connected to a clock enable (CKE) pin are typically deactivated. Therefore, power consumption may be reduced in the active power down mode and the precharge power down mode. When the active power down mode or the precharge power down mode proceed for more than a predetermined time, all the data stored in the DRAM is generally lost.

In the self refresh mode, the data stored in the DRAM is refreshed and maintained, typically by a signal automatically generated inside the DRAM. This distinguishes the self refresh mode from the active power down mode and the precharge power down mode. In the self refresh mode, a delay locked loop circuit of the DRAM is also typically deactivated.

The DRAM generally also has a standby mode (or an idle mode), which is a preparatory state, in which an active command or a mode register set (MRS) command can typically be performed. When the mode of the DRAM transitions from the self refresh mode to the standby mode, the DRAM generally immediately starts operating the delay locked loop circuit and synchronizing a system clock and an internal clock for several hundred cycles. The delay locked loop continues to operate during the standby mode.

Thus, in a conventional DRAM, because the delay locked loop circuit generally continuously operates in the standby mode, power consumption by the DRAM may be increased.

SUMMARY OF THE INVENTION

In accordance with various embodiments of the present invention, clock generating circuits for a semiconductor memory device are provided. The clock generating circuits include a delay locked loop (DLL) circuit that generates an internal clock signal for the semiconductor memory device. A control circuit activates the delay locked loop circuit for a predetermined time when the semiconductor memory device transitions from a self refresh mode, in which the DLL circuit is deactivated, to a standby mode. The control circuit may also be configured to deactivate the DLL circuit when the semiconductor memory device transitions from a power down mode, in which the DLL circuit is activated, to the standby mode. The semiconductor memory device may be a dynamic random access memory device and the predetermined time may be a number of clock cycles of the internal clock signal.

In further embodiments of the present invention, the control circuit includes a first control circuit that generates a control signal that is enabled for the predetermined time responsive to a first signal that indicates the semiconductor memory device has transitioned from the self refresh mode to the standby mode. A second control circuit activates the DLL circuit responsive to the first signal and deactivates the DLL circuit responsive to the control signal and responsive to a second signal that indicates the semiconductor memory device has transitioned from the power down mode to the standby mode.

In other embodiments of the present invention, the first control circuit includes a control signal generating circuit that outputs the control signal responsive to the first signal and a time out signal. The first control circuit further includes a counter circuit that generates the time out signal responsive to the control signal. The second control circuit may include a set pulse generating circuit that generates a set pulse signal responsive to the first signal and a reset pulse generating circuit that generates a reset pulse signal responsive to the control signal. A standby signal generating circuit activates the DLL circuit responsive to the set pulse and deactivates the DLL circuit responsive to the reset pulse signal and responsive to the second signal.

The set pulse generating circuit may include a delay circuit that determines a pulse width of the set pulse signal. The reset pulse generating circuit may include a delay circuit that determines a pulse width of the reset pulse signal. The predetermined time during which the DLL is activated after the standby mode is entered from the self refresh mode may be no less than an expected lock time for the DLL circuit. The predetermined time may be specified as a number of clock cycles of the internal clock signal. The power down mode may be a precharge power down mode.

In further aspects of the present invention, methods are provided for controlling a clock generating circuit of a semiconductor memory device. A delay locked loop (DLL) circuit of the clock generating circuit is activated when the semiconductor memory device transitions to a standby mode from a self refresh mode in which the DLL circuit is deactivated. The DLL circuit is then deactivated a predetermined time after the semiconductor memory device transitions to the standby mode from the self refresh mode. In further embodiments, the DLL circuit is also deactivated when the semiconductor memory device transitions to the standby mode from a power down mode in which the DLL circuit is activated.

In yet other embodiments of the present invention, semiconductor memory devices are provided which have a self refresh mode, a precharge power down mode, and a standby mode and which operate in synchronization with a system clock signal. The semiconductor memory device includes a delay locked loop circuit for generating an internal clock signal in synchronization with the system clock signal. The device further includes a control circuit for activating the delay locked loop circuit during a predetermined clock cycle of the internal clock signal when the mode of the semiconductor memory device is converted from the self refresh mode into the standby mode and then, deactivating the delay locked loop circuit and deactivating the delay locked loop circuit when the mode of the semiconductor memory device is converted from the precharge power down mode into the standby mode.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols. While the present invention is generally described herein with reference to embodiments in which an active state (set or "1") is a high voltage and an inactive (reset or "0") is a low voltage, it is to be understood that the present invention may also be implemented with a complementary logic in which the active state is a low voltage and the inactive state is a high voltage. Similarly, for such complementary logic embodiments reference to a rising edge herein is still to be understood as referring to a transition from an inactive state to an active state even though the associated voltage change is from a high to a low voltage.

Figure 1:
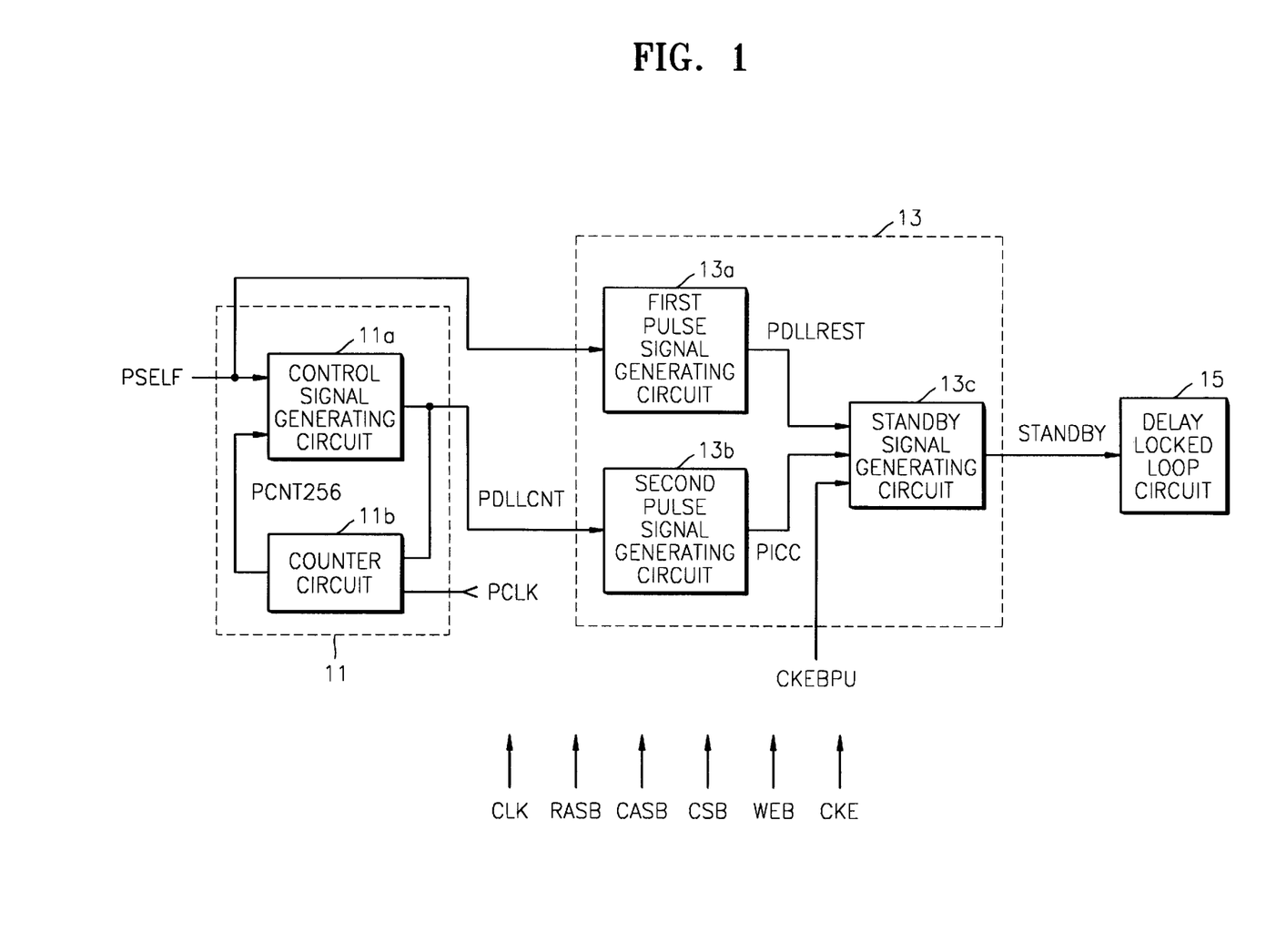
FIG. 1 is a block diagram illustrating a clock generating circuit in a dynamic random access memory (DRAM) according to embodiments of the present invention.

FIG. 1 is a block diagram showing a clock generating circuit in a dynamic random access memory (DRAM) according to embodiments of the present invention. Various components of the DRAM not related to the present invention are not illustrated in FIG. 1 as they will be generally understood by those of skill in the art without further description herein.

Referring to FIG. 1, the DRAM includes a delay locked loop circuit 15 and first and second control circuits 11 and 13 that may reduce power consumption by the delay locked loop circuit 15 when the DRAM is in a standby mode.

The delay locked loop circuit 15 illustrated in FIG. 1 is a circuit which may be used in a synchronous DRAM to generate an internal clock signal PCLK in synchronization with a system clock signal CLK. The DLL circuit 15 may consume significant amounts of power when it is activated (enabled). The first control circuit 11 generates a control signal PDLLCNT, which is enabled in response to a signal PSELF. The PSELF signal indicates whether the DRAM is in self refresh mode and, thus, may be used to indicate when the DRAM has transitioned from the self refresh mode into a standby mode. The PDLLCNT signal is disabled (deactivated) a predetermined time, such as a selected number of clock cycles, after the transition to standby mode.

The predetermined time may be of a duration no less than the expected locking time of the delay locked loop circuit 15 after the mode of the DRAM transitions from the self refresh mode to the standby mode. Therefore, the predetermined time is preferably greater than the locking time of the delay locked loop circuit 15. In various embodiments of the present invention, a time of about 256 cycles is provided. The locking time as used herein is the expected time needed for the delay locked loop circuit 15 to be locked.

As shown in FIG. 1, the first control circuit 11 includes a control signal generating circuit 11a and a counter circuit 11b. The control signal generating circuit 11a generates the control signal PDLLCNT in response to the signal PSELF indicating that the mode of the DRAM has transitioned from the self-refresh mode to the standby mode and to a signal PCNT256 indicating when the predetermined number of clock cycles has passed. Thus, the control signal PDLLCNT is enabled in response to the signal PSELF, which indicates that the mode of the DRAM is converted into the standby mode, and is disabled in response to the signal PCNT256, which indicates that the predetermined number of clock cycles has passed. The counter circuit 11b counts cycles of the internal clock signal PCLK in response to the control signal PDLLCNT and generates the signal PCNT256, which indicates that the predetermined clock cycle has passed.

The second control circuit 13 activates the delay locked loop circuit 15 in response to the signal PSELF, indicating that the mode of the DRAM has converted from the self refresh mode into the standby mode, and deactivates the delay locked loop circuit 15 when the control signal PDLLCNT is disabled. As shown in FIG. 1, the delay locked loop circuit 15 may also be disabled (deactivated) in response to a signal CKEBPU, which indicates that the mode of the DRAM has transitioned from the precharge power down mode into the standby mode.

More particularly, the second control circuit 13 includes a first pulse signal generating circuit 13a, a second pulse signal generating circuit 13b, and a standby signal generating circuit 13c. The first pulse signal generating circuit 13a generates a first pulse signal PDLLRESET in response to the signal PSELF, indicating that the mode of the DRAM has transitioned from the self refresh mode into the standby mode. The second pulse signal generating circuit 13b generates a second pulse signal PICC in response to the disablement of the control signal PDLLCNT. The standby signal generating circuit 13c generates a standby signal STANDBY that activates the delay locked loop circuit 15 in response to the first pulse signal PDLLRESET and deactivates the delay locked loop circuit 15 in response to the second pulse signal PICC or the signal CKEBPU.

As a result, the first and second control circuits 11 and 13 activate the delay locked loop 15 for a specified time (or number of clock cycles) when the mode of the DRAM is transitioned from the self refresh mode to the standby mode, and deactivate the delay locked loop circuit 15. The activated state may be more than the time needed or expected for the delay locked loop circuit 15 to lock. Also, the first and second control circuits 11 and 13 may immediately deactivate the delay locked loop circuit 15 when the mode of the DRAM transitions from the power down mode into the standby mode. This deactivation of the delay locked loop circuit 15 in the standby mode, may reduce power consumption by a semiconductor memory device including the delay locked loop circuit 15.

In the DRAM, the self refresh mode, the precharge power down mode, and the standby mode are generally set by controlling the logic states of a system clock CLK pin, a row address strobe RASB pin, a column address strobe CASB pin, a chip selection CSB pin, a write enable WEB pin, and a clock enable CKE pin. As operation of these aspects of the DRAM will be understood by those skilled in the art, detailed description thereof will not be presented herein.

The signal PSELF, which indicates that the mode of the DRAM has transitioned from the self refresh mode into the standby mode, and the signal CKEBPU, which indicates that the mode of the DRAM has transitioned from the precharge power down mode into the standby mode are generated by other circuitry inside the DRAM. When the self refresh mode is set, the signal PSELF transitions to a logic "high" level . When the mode of the DRAM transitions from the self refresh mode to the standby mode, the signal PSELF transitions to a logic "low" level. When the precharge power down mode is set, the signal CKEBPU transitions to the logic "high" level. When the mode of the DRAM changes from the precharge power down mode to the standby mode, the signal CKEBPU transitions to the logic "low" level.

Figure 2:
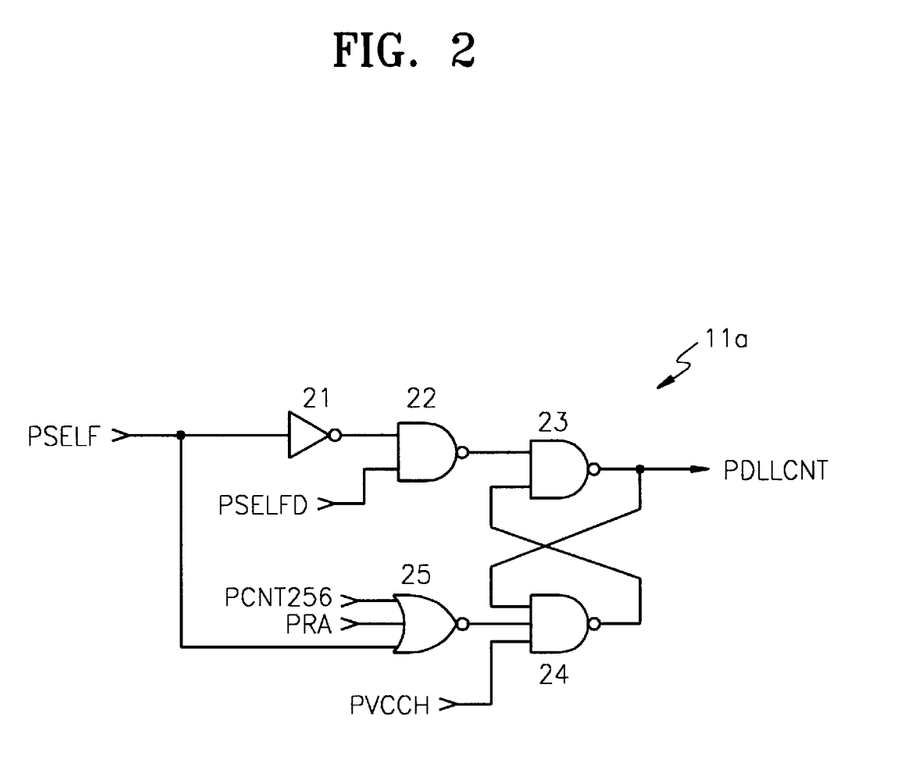
FIG. 2 is a circuit diagram illustrating the control signal generating circuit shown in FIG. 1 according to embodiments of the present invention.

FIG. 2 is a circuit diagram illustrating embodiments of a control signal generating circuit 11a as shown in FIG. 1. The control signal generating circuit 11a shown in FIG. 2 includes an inverter 21, NAND gates 22, 23, and 24, and a NOR gate 25. The NAND gates 23 and 24 define a latch.

Figure 5:
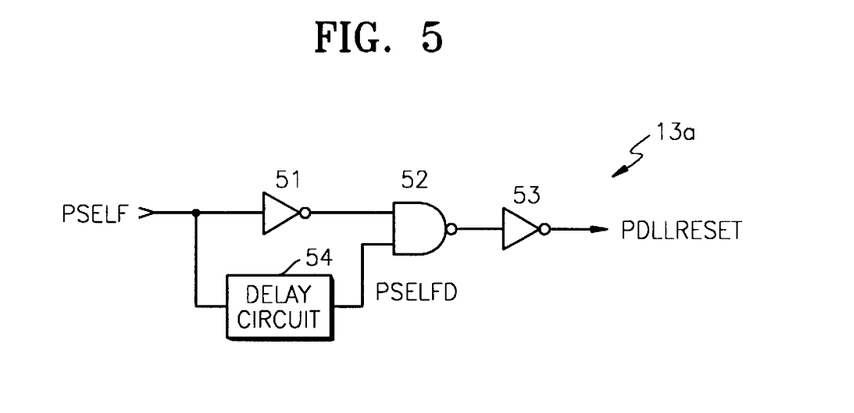
FIG. 5 is a circuit diagram illustrating the first pulse signal generating circuit shown in FIG. 1 according to embodiments of the present invention.

The signal PSELFD, which is the output signal of the delay circuit 54 shown in FIG. 5, is obtained by delaying the signal PSELF for a predetermined time. The signal PCNT256, which is the output signal of the counter circuit 11b shown in FIG. 3, indicates when a predetermined clock cycle has passed. As described by way of example herein for purposes of explanation, the predetermined clock cycle is set to be 256 cycles. When the 256 cycles have passed after the control signal PDLLCNT is enabled to the logic "high" level, the signal PCNT256 is switched to the logic "high" level. The signals PRA and PVCCH are not directly pertinent to the present invention. The signal PRA switches to the logic "low" level when the DRAM is in a precharge state. The signal PVCCH switches from the logic "low" level, which is an initial state, to the logic "high" level.

To be more specific, the signal PSELF is at the logic "high" level in the self refresh mode. Accordingly, the control signal PDLLCNT is placed in the logic "low" level. When the mode of the DRAM is switched from the self refresh mode into the standby mode, the signal PSELF is switched to the logic "low" level. As the signal PSELFD is at the logic "high" level, the control signal PDLLCNT is switched to the logic "high" state. Also, the control signal PDLLCNT is held at the logic "high" level by a latch structure. When the 256 cycles have passed after the control signal PDLLCNT is enabled to the logic "high" level, the signal PCNT256 is switched to the logic "high" level and the control signal PDLLCNT switches to the logic "low" level.

Figure 3:
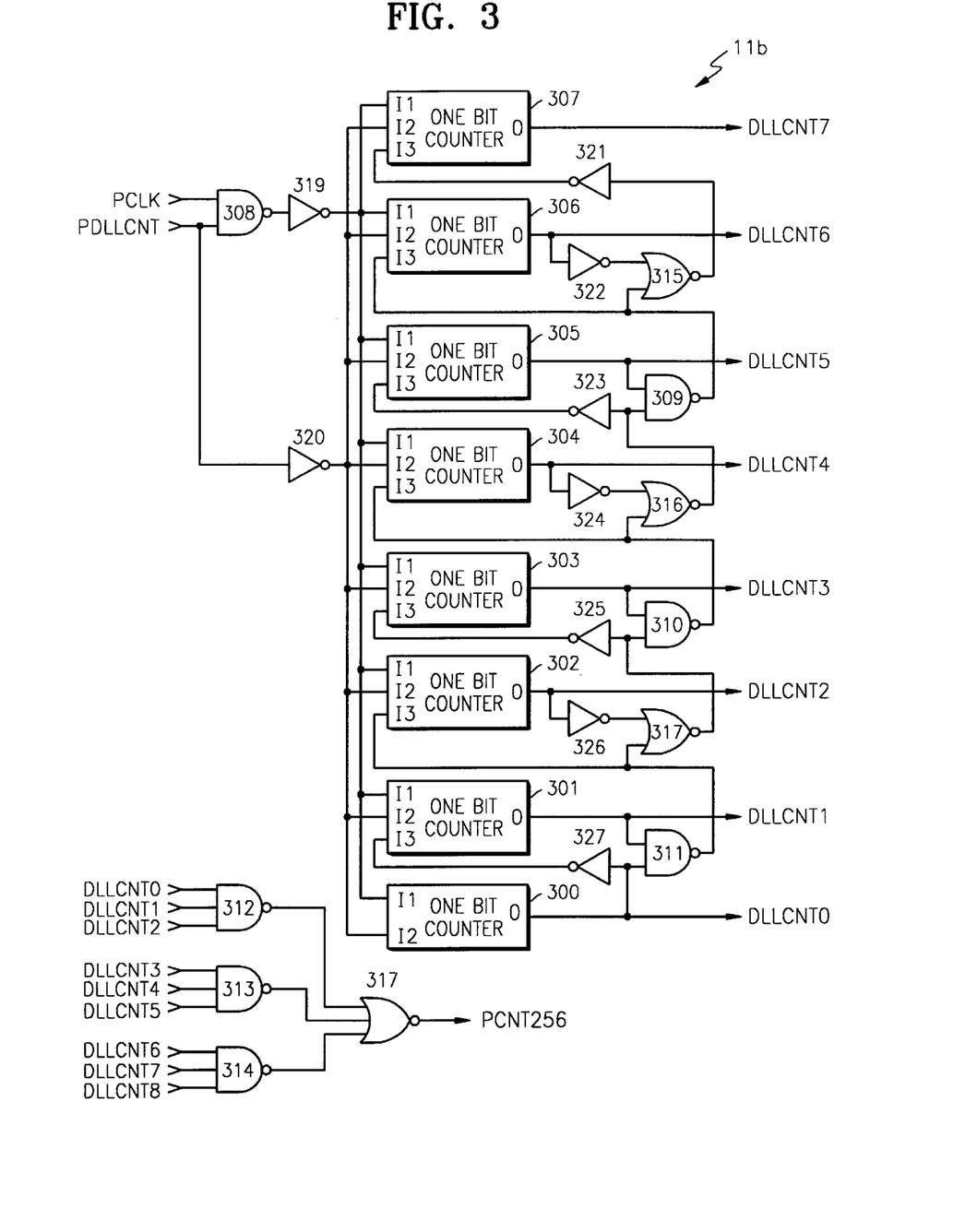
FIG. 3 is a circuit diagram illustrating the counter circuit shown in FIG. 1 according to embodiments of the present invention.

FIG. 3 is a circuit diagram illustrating embodiments of the counter circuit 11b shown in FIG. 1. The counter circuit 11b, which is an eight bit counter circuit in FIG. 3, counts the 256 cycles. The counter circuit 11b includes eight one bit counters 300 through 307, NAND gates 308 through 314, NOR gates 315 through 318, and inverters 319 through 427.

When the signal PDLLCNT is at the logic "low" level, the one bit counters 300 through 307 are all reset. Accordingly, the output signals DLLCNT0 through DLLCNT7 are switched to the logic "low" level. The signal PCNT256, therefore, is switched to the logic "low" level. When the signal PDLLCNT is at the logic "high" level, the outputs of the counter, which are constituted of DLLCNT0 through DLLCNT7, sequentially increase. When the 256 cycles have passed after the signal PDLLCNT transitions to the logic "high" level, the outputs DLLCNT0 through DLLCNT7 are all switched to the logic "high" level. Accordingly, the signal PCNT256 is switched to the logic "high" level.

Figure 4:
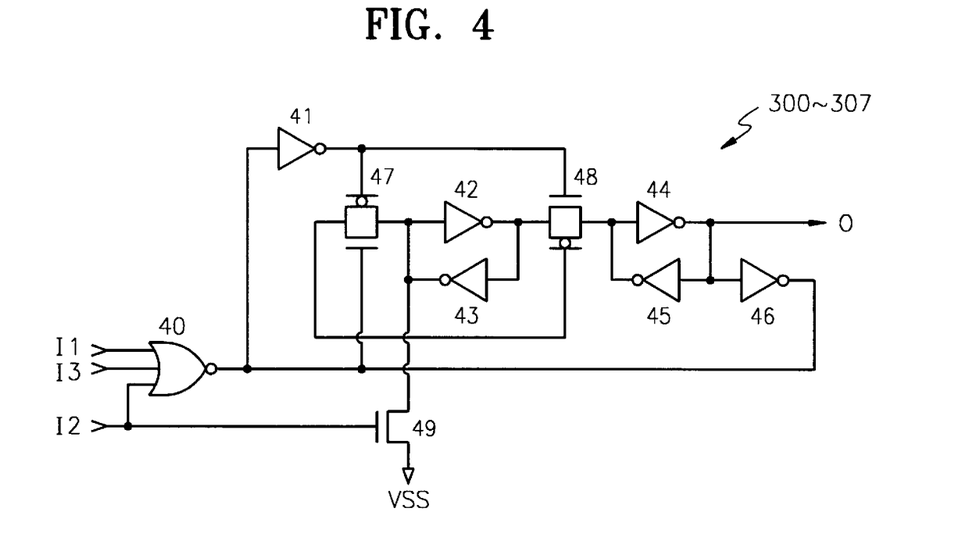
FIG. 4 is a circuit diagram illustrating the one bit counters shown in FIG. 3 according to embodiments of the present invention.

FIG. 4 is a circuit diagram illustrating embodiments of the one bit counters 300 through 307 shown in FIG. 3. Each of the one bit counters 300 through 307 include a NOR gate 40, inverters 41 through 46, transmission gates 47 and 48, and a pull down NMOS transistor 49.

The output signal of the inverter 319 shown in FIG. 3 is input to an input stage 11 and the output signal of the inverter 320 is input to an input stage 12. The carry of the previous one bit counter is input to an input stage 13. As the operations of the one bit counters are generally understood by those of skill in the art, further detailed description thereof will not be provided herein.

FIG. 5 is a circuit diagram illustrating embodiments of the first pulse signal generating circuit 13a shown in FIG. 1. The first pulse signal generating circuit 13a includes inverters 51 and 53, a NAND gate 52, and a delay circuit 54.

The first pulse signal generating circuit 13a, as shown in FIG. 5 is a positive pulse signal generating circuit which generates a first pulse signal PDLLRESET having a positive pulse corresponding to the delay time of the delay circuit 54 when the signal PSELF transitions from the logic "high" level to the logic "low" level.

Figure 6:
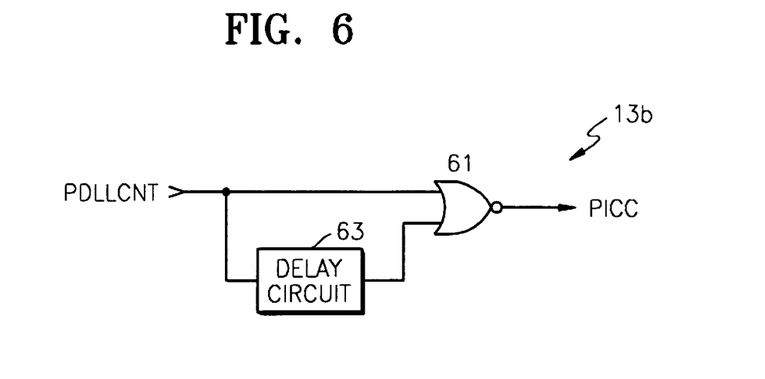
FIG. 6 is a circuit diagram illustrating the second pulse signal generating circuit shown in FIG. 1 according to embodiments of the present invention.

FIG. 6 is a circuit diagram illustrating embodiments of the second pulse signal generating circuit 13b shown in FIG. 1. The second pulse signal generating circuit 13b as shown in FIG. 6 includes a NOR gate 61 and an inversion delay circuit 63. The second pulse signal generating circuit 13b, is shown as a positive pulse signal generating circuit that generates a second pulse signal PICC having a positive pulse corresponding to the delay time of the inverting delay circuit 63 when the signal PDLLCNT transitions from the logic "high" level to the logic "low" level.

Figure 7:
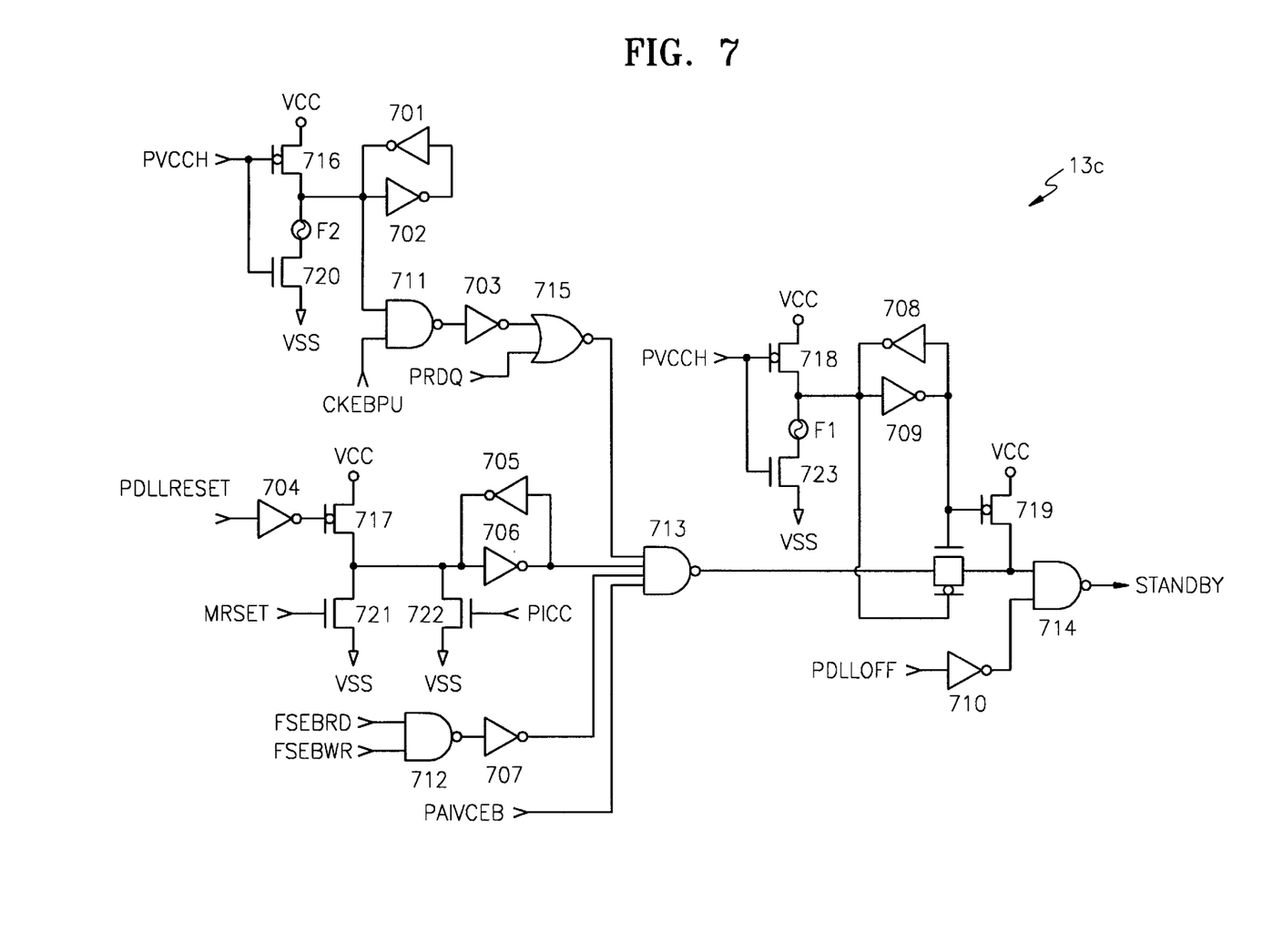
FIG. 7 is a circuit diagram illustrating the standby signal generating circuit shown in FIG. 1 according to embodiments of the present invention.

FIG. 7 is a circuit diagram illustrating embodiments of the standby signal generating circuit 13c shown in FIG. 1. The standby signal generating circuit 13c includes inverters 701 through 710, NAND gates 711 through 714, a NOR gate 715, pull up PMOS transistors 716 through 719, pull down NMOS transistors 720 through 722, a transmission gate 723, and fuses F1 and F2.

A signal PDLLOFF, which is established in a mode register set (MRS) mode after the power up of the DRAM, determines whether the delay locked loop circuit 15 shown in FIG. 1 is used or not. When the signal PDLLOFF is at the logic "high" level, the standby signal STANDBY is placed at the logic "high" level. Accordingly, the delay locked loop circuit 15 shown in FIG. 1 is deactivated. In other words, the delay locked loop circuit 15 does not operate and need not consume power.

A signal MRSET corresponds to MRS. When the signal MRSET is switched to the logic "high" level, the standby signal STANDBY is switched to the logic "high" level. Accordingly, the delay locked loop circuit 15 is deactivated. A signal FSEBRD indicates whether the DRAM is performing a read operation. When the signal FSEBRD is at the logic "low", it means that the DRAM is performing the read operation. A signal FSEBWR indicates whether the DRAM is performing a write operation. When the signal FSEBWR is at the logic "low" level, it means that the DRAM performs a write operation. When the signal FSEBRD is at the logic "low" level or when the signal FSEBWR is at the logic "low" level, the standby signal STANDBY is switched to the logic "low" level. Accordingly, the delay locked loop circuit 15 operates normally.

A signal PAIVCEB indicates that a memory cell array voltage generation circuit used inside the DRAM is operating. A signal PRDQ indicates that the row address of the DRAM is activated. The signals MRSET, FSEBRD, FSEBWR, PAIVCEB, PRDQ, and PDLLOFF do not impact on the description of the present invention. When the DRAM for the illustrated examples is in the precharge power down mode or the self refresh mode, the signals MRSET, PRDQ, and PDLLOFF are all at the logic "low" level and the signals FSEBRD, FSEBWR, and PAIVCEB are all at the logic "high" level.

A signal PDLLRESET, which is a pulse signal generated by the first pulse signal generating circuit 13a shown in FIG. 5, resets the delay locked loop circuit 15 shown in FIG. 1 and makes the delay locked loop circuit 15 start locking operations. When the signal PDLLRESET is at the logic "high" level, namely, when the mode of the DRAM is converted from the self refresh mode into the standby mode, the pull up PMOS transistor 717 is turned on. Accordingly, the output of the latch defined by the inverters 705 and 706 is switched to the logic "low" level. Therefore, the output of the NAND gate 713 is switched to the logic "high" level. At this time, since the signal PVCCH is at the logic "high" level and the fuse F1 is not cut off, the transmission gate 723 is already turned on. Therefore, the standby signal STANDBY is switched to the logic "low" level. Accordingly, the delay locked loop circuit 15 shown in FIG. 1 is activated and begins to operate.

When the signal PICC is switched to the logic "high" level, namely, when the mode of the DRAM changes from the self refresh mode into the standby mode and then the 256 cycles have passed, the pull down NMOS transistor 722 is turned on. Accordingly, the output of the latch defined by of the inverters 705 and 706 is switched to the logic "high" level. At this time, as the output of the NOR gate 715, the output of the inverter 707, and the signal PAIVCEB are at the logic "high" level, the output of the NAND gate 713 is switched to the logic "low" level. Therefore, the standby signal STANDBY is switched to the logic "high" level. Accordingly, the delay locked loop circuit 15 shown in FIG. 1 is deactivated and does not operate.

Also, for the embodiments shown in FIG. 7 when the signal CKEBPU switches to the logic "low" level, namely, when the DRAM changes from the precharge power down mode to the standby mode, the output of the NAND gate 711 is switched to the logic "high" level. At this time, as the signal PRDQ is at the logic "low" level, the output of the latch defined by the inverters 705 and 706 is at the logic "high" level, and the output of the inverter 707 and the signal PAIVCEB are all at the logic high level, the output of the NAND gate 713 is switched to the logic "low" level. Therefore, the standby signal STANDBY is switched to logic "high" level. Accordingly, the delay locked loop circuit 15 shown in FIG. 1 is deactivated and does not operate.

The method of using the fuses F1 and F2 will now be described. When the fuse F1 is cut, because the signal PVCCH is at the logic "low" level at an initial stage, the pull up PMOS transistor 718 is turned on. Accordingly, the output of the latch defined by the inverters 708 and 709 (the output of the inverter 708) is switched to the logic "high" level. Accordingly, the transmission gate 723 is turned off and the pull up PMOS transistor 719 is turned on. Thus, an input of the NAND gate 714 is switched to the logic high level. Therefore, the logic state of the standby signal STANDBY that determines the activation or deactivation of the delay locked loop circuit 15 is determined by only the signal PDLLOFF.

The fuse F2 determines whether to deactivate the delay locked loop circuit 15 in the previous precharge power down mode before the DRAM is changed into the standby mode. When the fuse F2 is cut, because the signal PVCCH is at the logic "low" level at the initial stage, the pull up PMOS transistor 716 is turned on. Accordingly, an input of the NAND gate 711 is switched to the logic "high" level. Also, as the signal CKEBPU is at the logic "high" level in the precharge power down mode, the output of the NAND gate 711 is at the logic low level and the output of the NAND gate 713 is switched to the logic high level. Therefore, the standby signal STANDBY is switched to the logic "low" level. Accordingly, the delay locked loop circuit 15 is activated and operates.

When the fuse F2 is not cut, because the PVCCH signal switches from the logic "low" level, which is the initial logic state, to the logic "high" level, the pull down NMOS transistor 720 is turned on. Accordingly, an input of the NAND gate 711 is switched to the logic "low" level. The output of the NAND gate 711 is then at the logic "high" level. As a result, the output of the NAND gate 713 is switched to the logic "low" level. Therefore, when the DRAM is in the precharge state, namely, when the signal PVCCH is at the logic "high" level, the standby signal STANDBY is always at the logic "high" level. Accordingly, the delay locked loop circuit 15 is deactivated and does not operate.

Figure 8:
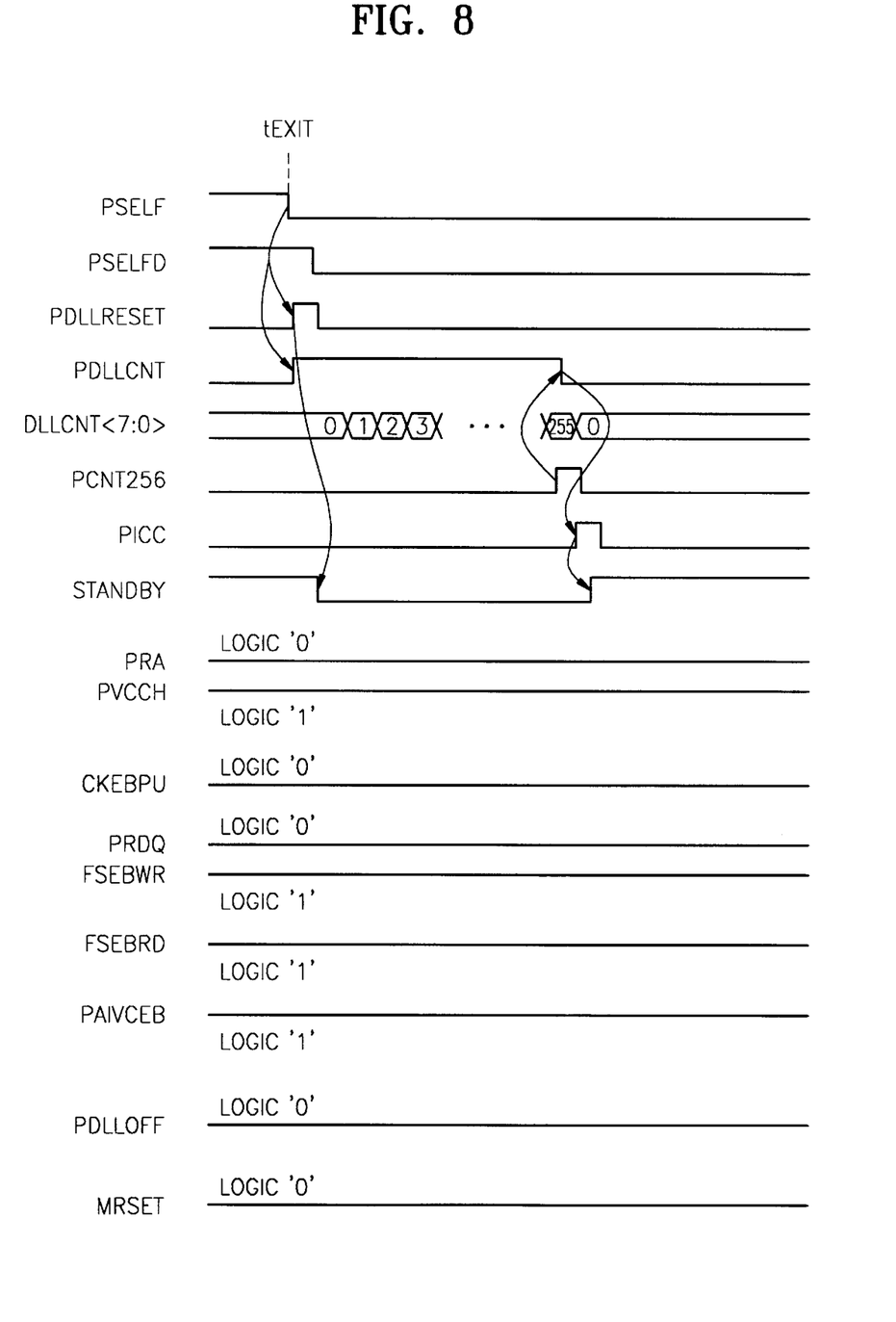
FIG. 8 is a timing diagram illustrating the operation of a clock generating circuit in a DRAM according to embodiments of the present invention when the mode of the DRAM transitions from a self refresh mode to a standby mode.
Figure 9:
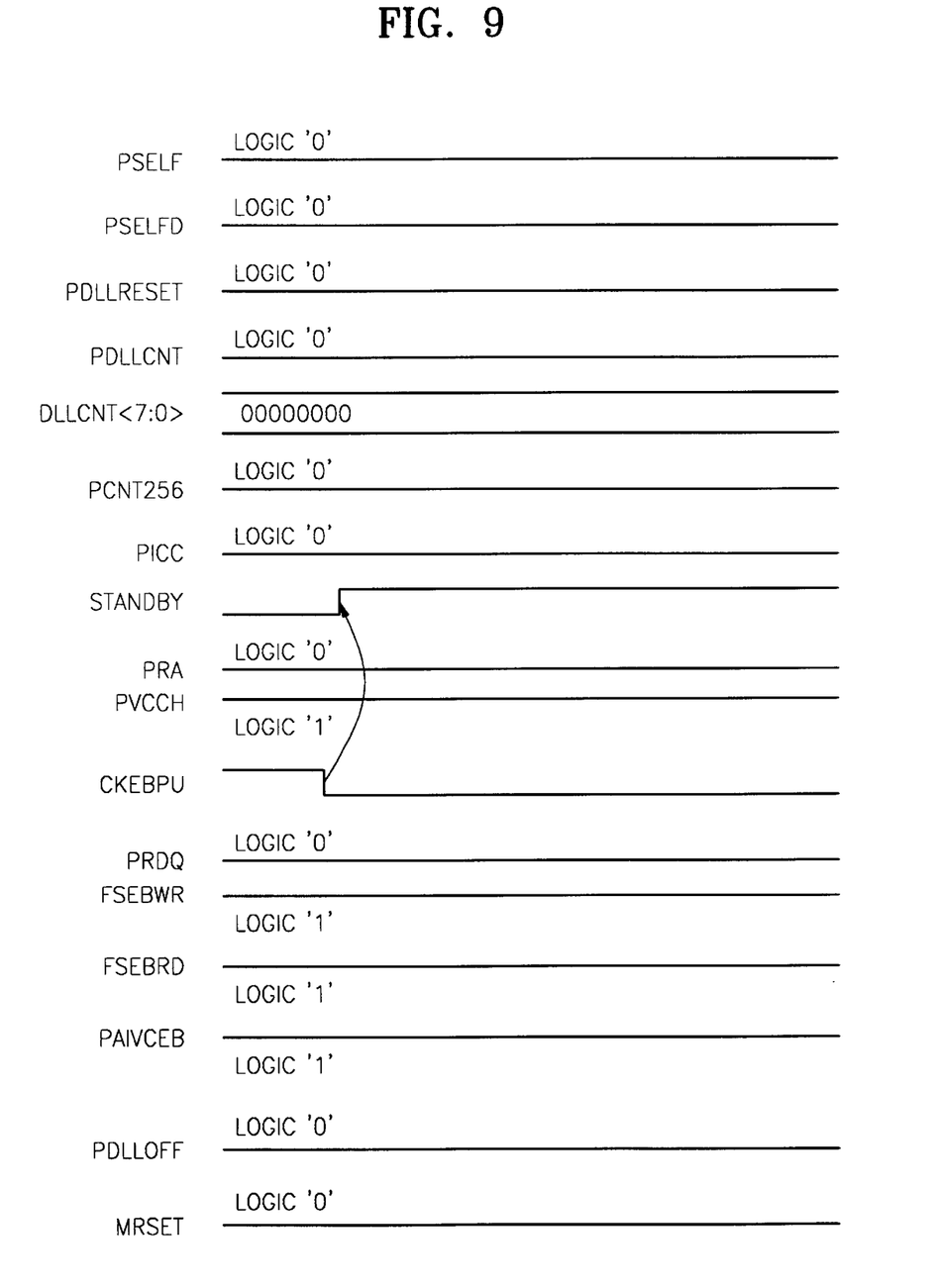
FIG. 9 is a timing diagram illustrating operation of a clock generating circuit in a DRAM according to embodiments of the present invention when the mode of the DRAM transitions from a precharge power down mode to the standby mode.

FIG. 8 is a timing diagram showing the operation of a DRAM according to the present invention when the mode of the DRAM is changed from the self refresh mode into the standby mode. FIG. 9 is a timing diagram showing the operation of a DRAM according to the present invention when the mode of the DRAM is changed from the precharge power down mode to the standby mode.

Referring to FIG. 8, when the mode of the DRAM changes from the self refresh mode into the standby mode, the signal PSELF is switched from the logic "high" level to the logic "low" level. The signals PRA, CKEBPU, PRDQ, PDLLOFF, and MRSET are at the logic "low" level. The signals PVCCH, FSEBWR, FSEBRD, and PAIVCEB are at the logic "high" level.

After a predetermined time has passed, the signal PSELFD is switched from the logic "high" level to the logic "low" level. The predetermined time corresponds to the delay time of the delay circuit 54 shown in FIG. 5. Accordingly, a signal PDLLRESET having a positive pulse corresponding to the delay time of the delay circuit 54 is generated by the first pulse signal generating circuit 13a.

When the positive pulse of the signal PDLLRESET is generated, the standby signal STANDBY is switched from the logic "high" level to the logic "low" level by the standby signal generating circuit 13c. Accordingly, the delay locked loop circuit 15 shown in FIG. 1 is activated and operates. In other words, the delay locked loop circuit 15 begins locking operations.

The signal PDLLCNT is enabled to the logic "high" level by the control signal generating circuit 11a. Accordingly, the eight bit counter circuit 11b begins to count the internal clock PCLK. When the 256 cycles of the internal clock PCLK have passed, the PCNT256, which is the output of the counter circuit 11b is switched to the logic "high" level. Accordingly, the signal PDLLCNT is disabled to the logic "low" level.

When the signal PDLLCNT is disabled to the logic "low" level, the signal PICC having a positive pulse corresponding to the delay time of the inverting delay circuit 63 is generated by the second pulse signal generating circuit 13b.

When the positive pulse of the signal PICC is generated, the signal STANDBY is switched from the logic "low" level to the logic "high" level by the standby signal generating circuit 13c. Accordingly, the delay locked loop circuit 15 is deactivated and does not operate.

Thus, a DRAM including a clock generating circuit according to the present invention may activate the delay locked loop circuit 15 for only a limited time, which time may be selected based on specified locking time of the delay locked loop circuit 15. For example, the 265 clock cycles following changing of the mode of the DRAM from the self refresh mode into the standby mode. The delay locked loop circuit 15 may then be deactivated to save power.

Referring to FIG. 9, when the mode of the DRAM changes from the precharge power down mode into the standby mode, the signal CKEBPU is switched from the logic "high" level to the logic "low" level. The signals PRA, PRDQ, PDLLOFF, and MRSET are at the logic "low" level. The signals PVCCH, FSEBWR, FSEBRD, and PAIVCEB are at the logic "high" level. The signal PSELF is at the logic "low" level. Accordingly, the signals PSELFD, PDLLRESET, PDLLCNT, PCNT256, and PICC are all at the logic "low" level.

When the signal CKEBPU is switched to the logic "high" level, the signal STANDBY is switched from the logic "low" level to the logic "high" level by the standby signal generating circuit 13c. Accordingly, the delay locked loop circuit 15 is deactivated and does not operate. Thus, the delay locked loop circuit 15 may be immediately deactivated when the mode of the DRAM changes from the precharge power down mode to the standby mode. Power consumption may, thus, be further reduced by deactivating the delay locked loop circuit in the standby mode.

The block diagram of FIG. 1 illustrates the architecture, functionality, and operation of possible implementations of circuits and methods for controlling power down of a delay locked loop circuit according to various embodiments of the present invention. In this regard, each block in the block diagram may represent a module, segment, or portion of code, which comprises one or more executable instructions for implementing the specified logical function(s). It will also be understood that each block of the block diagram illustration, and combinations of blocks in the block diagram illustration, can be implemented by special purpose hardware-based systems which perform the specified functions or steps, or combinations of special purpose hardware and computer instructions.

In the drawings and specification, there have been disclosed typical illustrative embodiments of the invention and, although specific terms are employed, they are used in a generic and descriptive sense only and not for purposes of limitation, the scope of the invention being set forth in the following claims.

That which is claimed is:

1. A clock generating circuit for a semiconductor memory device, the clock generating circuit comprising:
   a delay locked loop (DLL) circuit that generates an internal clock signal for the semiconductor memory device; and
   a control circuit that activates the delay locked loop circuit for a predetermined time when the semiconductor memory device transitions from a self-refresh mode in which the DLL circuit is deactivated to a standby mode.

2. The circuit of claim 1 wherein the control circuit is further configured to deactivate the DLL circuit when the semiconductor memory device transitions from a power down mode in which the DLL circuit is activated to the standby mode.

3. The circuit of claim 2 wherein the semiconductor memory device comprises a dynamic random access memory (DRAM) device and wherein the power down mode comprises a precharge power down mode.

4. The circuit of claim 2 wherein the control circuit comprises:
   a first control circuit that generates a control signal that is enabled for the predetermined time responsive to a first signal that indicates the semiconductor memory device has transitioned from the self refresh mode to the standby mode; and
   a second control circuit that activates the DLL circuit responsive to the first signal and deactivates the DLL circuit responsive to the control signal and responsive to a second signal that indicates the semiconductor memory device has transitioned from the power down mode to the standby mode.

5. The circuit of claim 4 wherein the first control circuit comprises:
   a control signal generating circuit that outputs the control signal responsive to the first signal and a time out signal; and
   a counter circuit that generates the time out signal responsive to the control signal.

6. The circuit of claim 5 wherein the second control circuit comprises:

a set pulse generating circuit that generates a set pulse signal responsive to the first signal;

a reset pulse generating circuit that generates a reset pulse signal responsive to the control signal; and a standby signal generating circuit that activates the DLL circuit responsive to the set pulse and deactivates the DLL circuit responsive to the reset pulse signal and responsive to the second signal.

7. The circuit of claim 6 wherein the set pulse generating circuit further comprises a delay circuit that determines a pulse width of the set pulse signal and wherein the reset pulse generating circuit further comprises a delay circuit that determines a pulse width of the reset pulse signal.

8. The circuit of claim 7 wherein the semiconductor memory device comprises a dynamic random access memory (DRAM) device.

9. The circuit of claim 8 wherein the predetermined time is no less than an expected lock time for the DLL circuit.

10. The circuit of claim 7 wherein the predetermined time comprises a number of clock cycles of the internal clock signal.

11. The circuit of claim 8 wherein the semiconductor memory device comprises a dynamic random access memory (DRAM) device and wherein the power down mode comprises a precharge power down mode.

12. The circuit of claim 1 wherein the control circuit comprises:

a first control circuit that generates a control signal that is enabled for the predetermined time responsive to a first signal that indicates the semiconductor memory device has transitioned from the self refresh mode to the standby mode; and a second control circuit that activates the DLL circuit responsive to the first signal and deactivates the DLL circuit responsive to the control signal.

13. The circuit of claim 12 wherein the first control circuit comprises:

a control signal generating circuit that outputs the control signal responsive to the first signal and a time out signal; and a counter circuit that generates the time out signal responsive to the control signal.

14. The circuit of claim 13 wherein the second control circuit comprises:

a set pulse generating circuit that generates a set pulse signal responsive to the first signal;

a reset pulse generating circuit that generates a reset pulse signal responsive to the control signal; and a standby signal generating circuit that activates the DLL circuit responsive to the set pulse and deactivates the DLL circuit responsive to the reset pulse signal.

15. The circuit of claim 14 wherein the semiconductor memory device comprises a dynamic random access memory (DRAM) device.

16. The circuit of claim 14 wherein the predetermined time is no less than an expected lock time for the DLL circuit.

17. The circuit of claim 14 wherein the predetermined time comprises a number of clock cycles of the internal clock signal.

18. The circuit of claim 1 wherein the semiconductor memory device comprises a dynamic random access memory (DRAM) device.

19. The circuit of claim 1 wherein the predetermined time is no less than an expected lock time for the DLL circuit.

20. The circuit of claim 1 wherein the predetermined time comprises a number of clock cycles of the internal clock signal.

21. A method for controlling a clock generating circuit of a semiconductor memory device, the method comprising the steps of:

activating a delay locked loop (DLL) circuit of the clock generating circuit when the semiconductor memory device transitions to a standby mode from a self refresh mode in which the DLL circuit is deactivated; and then deactivating the DLL circuit a predetermined time after the semiconductor memory device transitions to the standby mode from the self refresh mode.

22. The method of claim 21 further comprising the step of deactivating the DLL circuit when the semiconductor memory device transitions to the standby mode from a power down mode in which the DLL circuit is activated.

23. The method of claim 22 wherein the semiconductor memory device comprises a dynamic random access memory (DRAM) device and wherein the power down mode comprises a precharge power down mode.

24. The method of claim 22 wherein the predetermined time is no less than an expected lock time for the DLL circuit.

25. The method of claim 22 wherein the predetermined time comprises a number of clock cycles of an internal clock signal generated by the DLL circuit.

26. A semiconductor memory device, which has a self refresh mode, a precharge power down mode, and a standby mode and operates in synchronization with a system clock signal; comprising:

a delay locked loop circuit for generating an internal clock signal in synchronization with the system clock signal; and a control circuit for activating the delay locked loop circuit during a predetermined clock cycle of the internal clock signal when the mode of the semiconductor memory device is converted from the self refresh mode into the standby mode and then, deactivating the delay locked loop circuit and deactivating the delay locked loop circuit when the mode of the semiconductor memory device is converted from the precharge power down mode into the standby mode.

27. The semiconductor memory device of claim 26, wherein the control circuit comprises:

a first control circuit for generating a control signal, which is enabled in response to a first signal for informing that the mode of the semiconductor memory device is converted from the self refresh mode into the standby mode and is disabled after the predetermined clock cycle has passed; and a second control circuit for activating the delay locked loop circuit in response to the first signal and deactivating the delay locked loop circuit in response to the control signal or a second signal for informing that the mode of the semiconductor memory device is converted from the precharge power down mode into the standby mode.

28. The semiconductor memory device of claim 27, wherein the first control circuit comprises:

a control signal generating circuit for generating the control signal in response to the first signal and a third signal for informing that the predetermined clock cycle has passed; and a counter circuit for generating the third signal by counting the internal clock signal in response to the control signal.

29. The semiconductor memory device of claim 27, wherein the second control circuit comprises:

a first pulse signal generating circuit for generating a first pulse signal in response to the first signal;

a second pulse signal generating circuit for generating a second pulse signal in response to the disablement of the control signal; and a standby signal generating circuit for generating a standby signal for activating the delay locked loop circuit in response to the first pulse signal and deactivating the delay locked loop circuit in response to the second pulse signal or a signal for informing that the mode of the semiconductor memory device is converted from the precharge power down mode into the standby mode.

30. The semiconductor memory device of claim 26, wherein the predetermined clock cycle is larger than a time taken for the delay locked loop circuit to be locked.

31. A method for controlling the power down of a semiconductor memory device, which comprises a delay locked loop circuit for generating an internal clock signal in synchronization with a system clock signal and has a self refresh mode, a precharge power down mode, and a standby mode, comprising the steps of:

(a) activating the delay locked loop circuit during a predetermined clock cycle of the internal clock signal when the mode of the semiconductor memory device is converted from the self refresh mode into the standby mode and then, deactivating the delay locked loop circuit; and (b) deactivating the delay locked loop circuit when the mode of the semiconductor memory device is converted from the precharge power down mode into the standby mode.

32. The method of claim 31, wherein the step (a) comprises the steps of:

(a1) generating a control signal, which is enabled in response to a first signal for informing that the mode of the semiconductor memory device is converted from the self refresh mode into the standby mode and is disabled after the redetermined clock cycle has passed; and (a2) activating the delay locked loop circuit in response to the first signal and deactivating the delay locked loop circuit when the control signal is disabled.

33. The method of claim 32, wherein the step (a1) comprises the steps of:

(a11) generating the control signal in response to the first signal and a second signal for informing that the predetermined clock cycle has passed; and (a12) generating the second signal by counting the internal clock signal in response to the control signal.

34. The method of claim 32, wherein the step (a2) comprises the steps of:

(a21) generating a first pulse signal in response to the first signal;

(a22) generating a second pulse signal in response to the disablement of the control signal; and (a23) generating a standby signal for activating the delay locked loop circuit in response to the first pulse signal and deactivating the delay locked loop circuit in response to the second pulse signal.

35. The method of claim 31, wherein the step (b) comprises the step of generating a standby signal for deactivating the delay locked loop circuit in response to a signal for informing that the mode of the semiconductor memory device is converted from the precharge power down mode into the standby mode.

36. The method of claim 31, wherein the predetermined clock cycle is larger than a time taken for the delay locked loop circuit to be locked.

* * * * *